(12) United States Patent
Tomokuni et al.

(10) Patent No.: US 12,398,484 B2
(45) Date of Patent: *Aug. 26, 2025

(54) QUARTZ GLASS CRUCIBLE FOR GROWING A SINGLE CRYSTAL SILICON INGOT BY A CZOCHRALSKI (CZ) METHOD

(71) Applicant: SHIN-ETSU QUARTZ PRODUCTS CO., LTD., Tokyo (JP)

(72) Inventors: Kazuki Tomokuni, Echizen (JP); Yoshinori Ikeda, Echizen (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 128 days.

This patent is subject to a terminal disclaimer.

(21) Appl. No.: 18/018,188

(22) PCT Filed: Jul. 2, 2021

(86) PCT No.: PCT/JP2021/025116
§ 371 (c)(1),
(2) Date: Jan. 26, 2023

(87) PCT Pub. No.: WO2022/024666
PCT Pub. Date: Feb. 3, 2022

(65) Prior Publication Data
US 2023/0265579 A1 Aug. 24, 2023

(30) Foreign Application Priority Data
Jul. 30, 2020 (JP) .................. 2020-128995

(51) Int. Cl.
C30B 35/00 (2006.01)
C30B 15/12 (2006.01)
C30B 29/06 (2006.01)

(52) U.S. Cl.
CPC .............. *C30B 15/12* (2013.01); *C30B 29/06* (2013.01); *C30B 35/002* (2013.01)

(58) Field of Classification Search
CPC ......... C30B 15/00; C30B 15/10; C30B 15/12; C30B 29/00; C30B 29/02; C30B 29/06; C30B 35/00; C30B 35/002
(Continued)

(56) References Cited

U.S. PATENT DOCUMENTS 4,713,104 A * 12/1987 Brown .................. C30B 35/002
65/144
2005/0139153 A1 6/2005 Kishida et al.
(Continued)

FOREIGN PATENT DOCUMENTS

CN 111320393 A 6/2020
JP H10-025185 A 1/1998
(Continued)

OTHER PUBLICATIONS

Aug. 3, 2021 Search Report issued in International Patent Application No. PCT/JP2021/025116.
(Continued)

*Primary Examiner* — Kenneth A Bratland, Jr.
(74) *Attorney, Agent, or Firm* — Oliff PLC

(57) ABSTRACT

A quartz glass crucible for growing a single crystal silicon ingot by a CZ method, where the crucible has a closed-end cylindrical shape including a cylindrical straight body portion, a first curved portion continuous with a lower end of the straight body portion and having a first curvature radius R1, a second curved portion continuous with the first and having a second curvature radius R2, and a bottom portion continuous with second curved portion, R1 and R2 have a relationship of R1<R2, and an outer surface of the bottom portion forms a flat surface perpendicular to a central axis of the crucible or a concave surface concave with respect to the flat surface. This provides a closed-end cylindrical quartz glass crucible for growing a single crystal silicon ingot by a
(Continued)

CZ method that can be stable and self-supporting when it is disposed inside a closed-end cylindrical graphite crucible.

4 Claims, 3 Drawing Sheets

(58) Field of Classification Search
USPC ........... 117/11, 13, 200, 206, 208, 213, 928, 117/931–932
See application file for complete search history.

(56) References Cited

U.S. PATENT DOCUMENTS

| | | |
|---|---|---|
| 2010/0126407 A1 | 5/2010 | Kishi et al. |
| 2010/0162947 A1* | 7/2010 | Harada .................. C30B 15/10 117/206 |
| 2011/0014582 A1 | 1/2011 | Phillips et al. |
| 2011/0015329 A1 | 1/2011 | Phillips et al. |
| 2011/0177284 A1 | 7/2011 | Phillips et al. |
| 2012/0252950 A1 | 10/2012 | Phillips et al. |
| 2012/0280429 A1 | 11/2012 | Ravi et al. |
| 2013/0026469 A1 | 1/2013 | Phillips et al. |
| 2014/0053772 A1 | 2/2014 | Yamagata |
| 2015/0027364 A1 | 1/2015 | Sudo et al. |
| 2020/0190688 A1 | 6/2020 | Saito et al. |
| 2023/0265583 A1* | 8/2023 | Tomokuni ............... C30B 15/10 117/213 |

FOREIGN PATENT DOCUMENTS

| | | | |
|---|---|---|---|
| JP | H10-087306 A | 4/1998 | |
| JP | H11-217290 A | 8/1999 | |
| JP | 2000-185995 A | 7/2000 | |
| JP | 2003-020234 A | 1/2003 | |
| JP | 2005-206448 A | 8/2005 | |
| JP | 2007186354 A | * 7/2007 | |
| JP | 2007269533 A | * 10/2007 | ............... C03C 3/06 |
| JP | 2011-088776 A | 5/2011 | |
| JP | 2012-017245 A | 1/2012 | |
| JP | 2013-139356 A | 7/2013 | |
| JP | 2013-139359 A | 7/2013 | |
| TW | 201111465 A | 4/2011 | |
| TW | 1547603 B | 9/2016 | |

OTHER PUBLICATIONS

Jan. 31, 2023 International Preliminary Report on Patentability issued in International Patent Application No. PCT/JP2021/025116.
Jul. 9, 2024 Extended European Search Report issued in European Patent Application No. 21849938.2.
Jul. 9, 2024 Office Action issued in Japanese Patent Application No. 2020-128995.
Dec. 10, 2024 Office Action issued in Japanese Patent Application No. 2020-128995.
Jan. 14, 2025 Office Action issued in Taiwanese Patent Application No. 110124750.
Feb. 13, 2025 Office Action issued in Korean Patent Application No. 10-2023-7003108.
Jun. 19, 2025 Office Action issued in Singaporean Patent Application No. 11202300603P.

* cited by examiner

[FIG. 1]
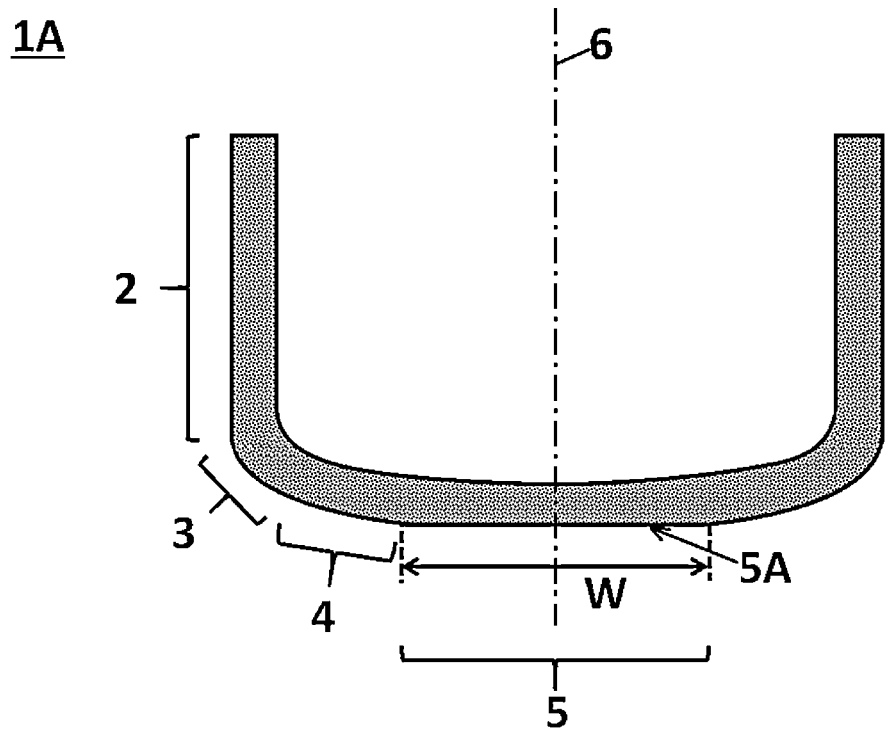
[FIG. 2]
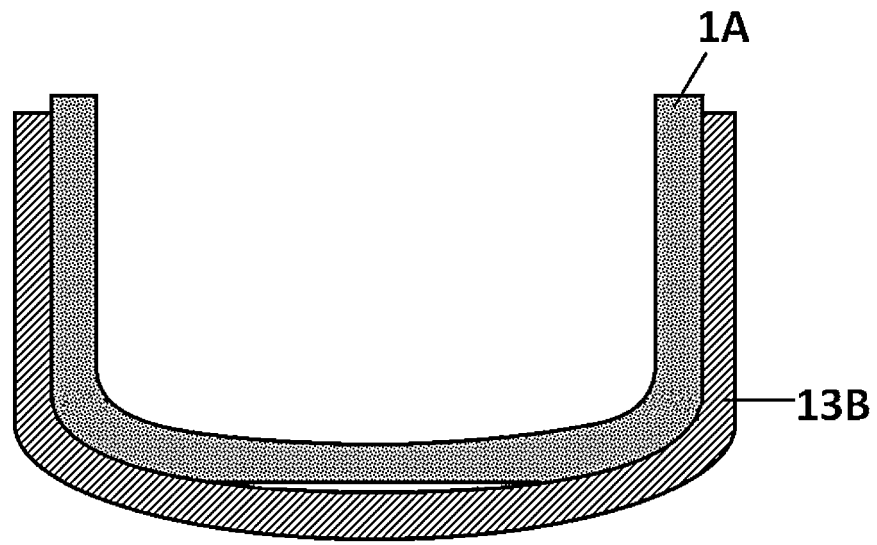

[FIG. 3]
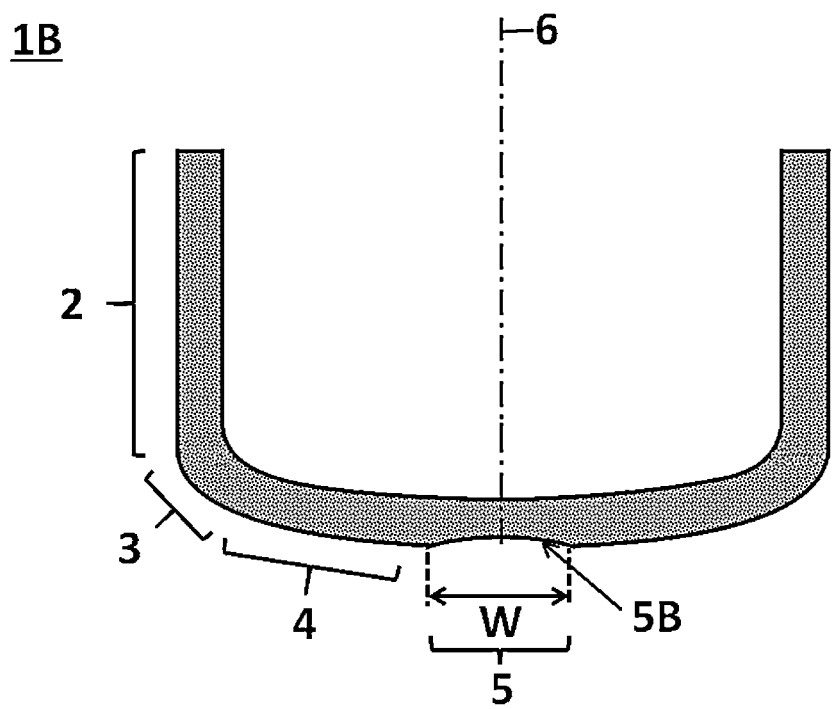

[FIG. 4] RELATED ART
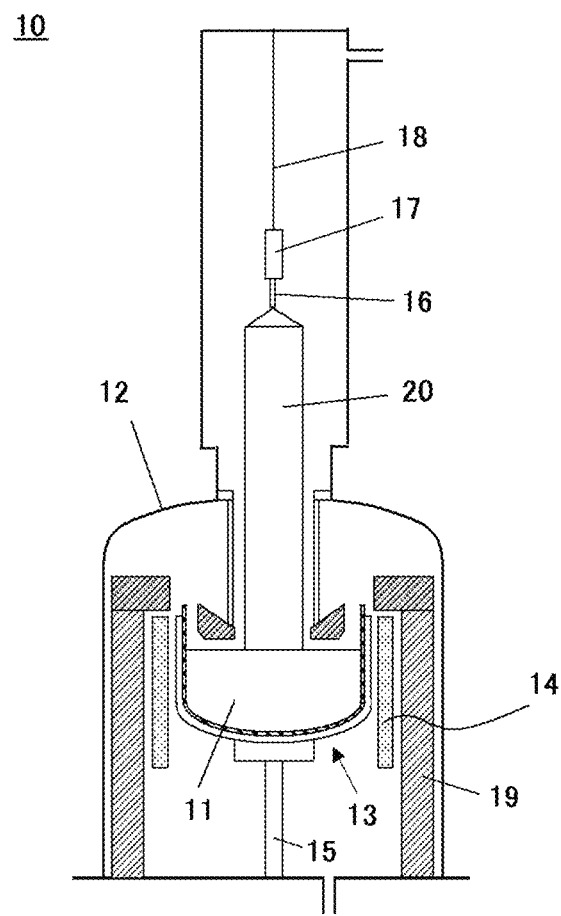
[FIG. 5]
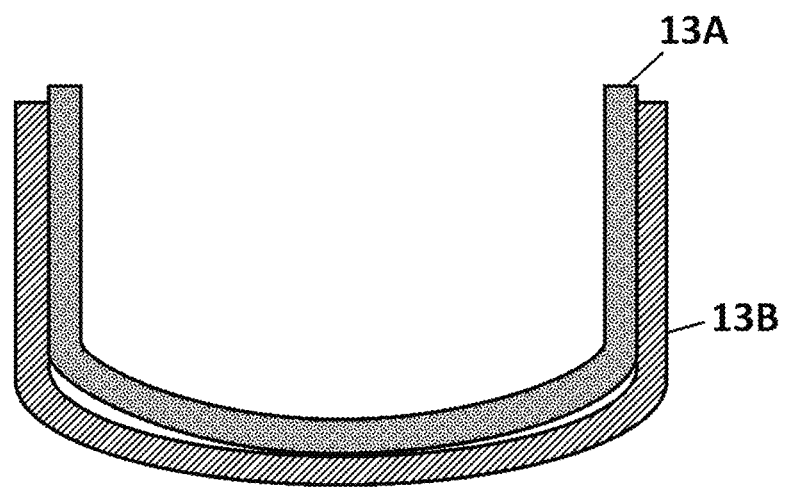

QUARTZ GLASS CRUCIBLE FOR GROWING A SINGLE CRYSTAL SILICON INGOT BY A CZOCHRALSKI (CZ) METHOD

TECHNICAL FIELD

The present invention relates to a quartz glass crucible for growing a single crystal silicon ingot by a Czochralski method (hereinafter referred to as the "CZ method").

BACKGROUND ART

The CZ method is known as a method for manufacturing a single crystal. In particular, the CZ method is widely adopted in the industry for most single crystal silicon to be used as materials for semiconductor electronic components. In the CZ method, polycrystalline silicon or the like charged in a quartz glass crucible is melted by a heater, and then a seed crystal is dipped into the surface of the silicon melt, followed by pulling up the seed crystal dipped in the silicon melt while rotating the seed crystal and the quartz glass crucible to grow a single crystal with the same crystal orientation as the seed crystal.

FIG. 4 is a conceptual schematic diagram of a pulling apparatus used to pull a single crystal by the CZ method described above. As shown in FIG. 4, the single crystal pulling apparatus 10 includes a pulling chamber 12, a crucible 13 provided inside the pulling chamber 12, a heater 14 disposed around the crucible 13, a crucible holding shaft 15 and its rotating and lifting mechanism (not shown) for rotating and lifting the crucible 13, a seed chuck 17 for holding a seed crystal 16 of silicon, a wire 18 for pulling the seed chuck 17, and a winding mechanism (not shown) for rotating or winding the wire 18. Further, a heat insulator 19 is disposed around an outer periphery of the heater 14. Single crystal silicon 20 is pulled by the wire 18 from a raw material silicon melt 11.

The crucible 13 disposed inside the single crystal pulling apparatus 10 is composed of a closed-end cylindrical quartz glass crucible containing a raw material melt and a closed-end cylindrical graphite crucible (sometimes referred to as a "carbon susceptor") containing therein the quartz glass crucible (e.g., see Patent Literatures 1 and 2).

CITATION LIST

Patent Literature

Patent Document 1: JP 2012-017245 A
Patent Document 2: JP 2013-139356 A

SUMMARY OF INVENTION

Technical Problem

While a quartz glass crucible is dimensioned to be received inside a graphite crucible, it is difficult to fabricate the quartz glass crucible such that an outer surface thereof is in complete contact with an inner surface of the graphite crucible, due to their fabrication errors and other factors. Earnest studies by the present inventors have revealed that, while the outer surface of the quartz glass crucible is shaped to have a convex curved surface to follow the shape of the inner surface of the graphite crucible, any individual variations, such as manufacturing errors in the shapes of the outer surface of the quartz glass crucible and the inner surface of the graphite crucible, may result in point contact between a bottom portion of the outer surface of the quartz glass crucible 13A and the inner surface of the graphite crucible 13B when the quartz glass crucible 13A is disposed inside the graphite crucible 13B as shown in FIG. 5, rendering the quartz glass crucible 13A unstable. Any vibrations of the quartz glass crucible 13A inside the graphite crucible 13B may damage the quartz glass crucible 13A inside the graphite crucible 13B. Additionally, during manufacture of a single crystal, the silicon melt will vibrate to cause melt surface vibrations that make it difficult to pull the single crystal silicon, and what is more, the quartz glass crucible 13A will become eccentric during pulling of the single crystal silicon, making it impossible to supply heat uniformly to the silicon ingot, which leads to quality degradation of the silicon ingot.

To address the above problems, it will be contemplated that compatible quartz glass crucible 13A and graphite crucible 13B are selected and combined to provide a stable crucible 13. However, this requires a trial-and-error approach to find a compatible combination of the quartz glass crucible 13A and the graphite crucible 13B, which is very inefficient and does not necessarily guarantee achieving a preferable combination.

The present invention has been made to solve the above problems. An object of the present invention is to provide a closed-end cylindrical quartz glass crucible for growing a single crystal silicon ingot by the CZ method that can be stable and self-supporting when it is disposed inside a closed-end cylindrical graphite crucible.

Solution to Problem

The present invention has been made to achieve the above object, and provides a quartz glass crucible for growing a single crystal silicon ingot by a CZ method, wherein the quartz glass crucible has a closed-end cylindrical shape comprising a cylindrical straight body portion, a first curved portion continuous with a lower end of the straight body portion and having a first curvature radius R1, a second curved portion continuous with the first curved portion and having a second curvature radius R2, and a bottom portion continuous with the second curved portion, the first curvature radius R1 and the second curvature radius R2 have a relationship of R1<R2, and an outer surface of the bottom portion forms a flat surface perpendicular to a central axis of the quartz glass crucible or a concave surface concave with respect to the flat surface.

Such a quartz glass crucible can be stable and self-supporting when it is disposed inside a graphite crucible, regardless of individual variations in the quartz glass crucible and the graphite crucible. The inventive quartz glass crucible can also provide better operational efficiency and safety during normal storage because it can be stably stored with its bottom portion facing down, in the same manner as when disposed inside a graphite crucible. Additionally, the inventive quartz glass crucible can suppress any change or disturbance in conditions of the convection flow of the silicon melt during growing of the single crystal silicon ingot by the CZ method.

In the quartz glass crucible, the first curvature radius R1 may be in a range of 120 mm≤R1≤240 mm, and the second curvature radius R2 may be in a range of 750 mm≤R2≤880 mm.

With this feature, any change or disturbance in conditions of the convection flow of the silicon melt can be further suppressed.

In the quartz glass crucible, a width of the bottom portion when viewed in a cross-section including the central axis of the quartz glass crucible may be 60 mm or more.

With this feature, point contact between the outer surface of the bottom portion of the quartz glass crucible and the inner surface of the bottom portion of the graphite crucible can be inhibited in a more stable manner.

Advantageous Effects of Invention

As described above, the inventive quartz glass crucible can be stable and self-supporting when it is disposed inside a graphite crucible, regardless of individual variations in the quartz glass crucible and the graphite crucible. The inventive quartz glass crucible can also provide better operational efficiency and safety because it can be stably stored with its bottom portion facing down, in the same manner as when disposed inside a graphite crucible. Additionally, the inventive quartz glass crucible can suppress any change or disturbance in conditions of the convection flow of the silicon melt during growing of the single crystal silicon ingot by the CZ method.

BRIEF DESCRIPTION OF DRAWINGS

FIG. 1 illustrates an example of a quartz glass crucible according to the present invention.

FIG. 2 illustrates the quartz glass crucible according to the present invention when it is installed inside a graphite crucible.

FIG. 3 illustrates another example of the quartz glass crucible according to the present invention.

FIG. 4 is a schematic conceptual diagram of a pulling apparatus.

FIG. 5 illustrates a quartz glass crucible when it is installed inside a graphite crucible (an example of a related art).

DESCRIPTION OF EMBODIMENTS

Hereinafter, the present invention will be described in detail, but the present invention is not limited to the following description.

As described above, a need has existed for a closed-end cylindrical quartz glass crucible for growing a single crystal silicon ingot by the CZ method that can be stable and self-supporting when it is disposed inside a closed-end cylindrical graphite crucible.

The present inventors have earnestly studied to achieve the above object and consequently found that a quartz glass crucible for growing a single crystal silicon ingot by the CZ method that has a closed-end cylindrical shape comprising a cylindrical straight body portion, a first curved portion continuous with a lower end of the straight body portion and having a first curvature radius $R1$, a second curved portion continuous with the first curved portion and having a second curvature radius $R2$, and a bottom portion continuous with the second curved portion, where the first curvature radius $R1$ and the second curvature radius $R2$ have a relationship of $R1<R2$ and an outer surface of the bottom portion forms a flat surface perpendicular to a central axis of the quartz glass crucible or a concave surface concave with respect to the flat surface, can be stable and self-supporting when it is disposed inside a graphite crucible, regardless of individual variations in the quartz glass crucible and the graphite crucible, and found that such a quartz glass crucible also can provide better operational efficiency and safety during normal storage and further can suppress any change or disturbance in conditions of the convection flow of the silicon melt during growing of the single crystal silicon ingot by the CZ method. This finding has led to the completion of the present invention.

A description is given below with reference to the drawings.

First of all, the present inventors contemplated a closed-end cylindrical quartz glass crucible for use in a crucible for growing a single crystal silicon ingot by the CZ method, where the quartz glass crucible can be stable and self-supporting when it is disposed inside a closed-end graphite crucible, and found that the quartz glass crucible becomes unstable due to point contact between an outer surface of a bottom portion of the quartz glass crucible and an inner surface of a bottom portion of the graphite crucible, which is caused by individual variations such as manufacturing errors in the shape of the outer surface of the bottom portion of the quartz glass crucible during its manufacture. The present inventors have found that shaping the outer surface of the bottom portion of the quartz glass crucible into a flat surface perpendicular to the central axis of the quartz glass crucible (hereinafter simply referred to as a "flat surface") or a concave surface concave with respect to this flat surface (hereinafter simply referred to as a "concave surface") can inhibit the point contact, thus allowing the quartz glass crucible to be stably placed inside the graphite crucible.

However, simply shaping the outer surface of the bottom portion of a conventional quartz glass crucible into a flat surface or a concave surface leads to a reduced thickness of the bottom portion of the quartz glass crucible, which may reduce the strength and may affect conditions of the convection flow of the silicon melt due to changes occurring in heat transfer balance in the crucible during growing of the single crystal silicon. On the other hand, assuring the thickness of the bottom portion of the quartz glass crucible requires changing the shape of the inner surface of the quartz glass crucible, but it has been found that changing the shape of the inner surface of the quartz glass crucible affects conditions of the convection flow of the silicon melt. Thus, the present inventors have found that a quartz glass crucible that does not affect conditions of the convection flow of the silicon melt even with the outer surface of its bottom portion being shaped into a flat surface or a concave surface can be achieved by shaping the quartz glass crucible such that it has a closed-end cylindrical shape including a first curved portion continuous with a lower end of a cylindrical straight body portion and having a first curvature radius $R1$, a second curved portion continuous with the first curved portion and having a second curvature radius $R2$, and a bottom portion continuous with the second curved portion, where the first curvature radius $R1$ and the second curvature radius $R2$ have a relationship of $R1<R2$. This finding has led to the completion of the present invention.

First Embodiment

FIG. 1 illustrates an example of a quartz glass crucible according to the present invention. This quartz glass crucible 1A has a closed-end cylindrical shape including a cylindrical straight body portion 2, a first curved portion 3 continuous with a lower end of the straight body portion 2 and having a first curvature radius $R1$, a second curved portion 4 continuous with the first curved portion 3 and having a second curvature radius R2, and a bottom portion 5 continuous with the second curved portion 4, where the first curvature radius R1 and the second curvature radius R2 satisfy the relationship of R1<R2. The bottom portion 5 has an outer surface that is shaped into a flat surface 5A perpendicular to the central axis 6 of the quartz glass crucible.

FIG. 2 illustrates the quartz glass crucible 1A according to the present invention when it is installed inside a graphite crucible. Since the bottom portion 5 of the quartz glass crucible 1A has the flat surface 5A perpendicular to the central axis 6 of the quartz glass crucible as shown in FIG. 1, point contact between the outer surface of the bottom portion of the quartz glass crucible 1A and the inner surface of the bottom portion of the graphite crucible 13B is avoided as shown in FIG. 2, allowing the quartz glass crucible 1A to be stable and self-supporting when it is disposed inside the graphite crucible 13B. While a gap is formed between the quartz glass crucible 1A and the graphite crucible 13B as shown in FIG. 2, problems such as rattling will not occur because an outer edge of the bottom portion of the quartz glass crucible 1A is in surface contact with the inner surface of the graphite crucible 13B.

Further, this quartz glass crucible 1A is configured such that it includes the first curved portion 3 continuous with the lower end of the cylindrical straight body portion 2 and having the first curvature radius R1 and the second curved portion 4 continuous with the first curved portion 3 and having the second curvature radius R2, where the first curvature radius R1 and the second curvature radius R2 satisfy the relationship of R1<R2. Accordingly, there is little effect on the shape of the inner surface of the quartz glass crucible even when the flat surface 5A is formed. As such, there is also little effect on conditions of the convection flow of the silicon melt during growing of the single crystal silicon ingot by the CZ method.

Conventionally, when a quartz glass crucible is stored, a jig is used to support the bottom portion of the quartz glass crucible in a stable manner or the quartz glass crucible is placed with its bottom portion facing up and its opening facing down. However, since a quartz glass crucible for growing a large-diameter single crystal silicon ingot in particular has a large size, turning it upside down requires high amounts of labor and also involves the risk of falling or the like. In contrast, the inventive quartz glass crucible provides better operational efficiency and safety during normal storage because it can be stably stored with its bottom portion facing down, in the same manner as when disposed inside a graphite crucible, without the use of a special jig or the like.

While the first curvature radius R1 and the second curvature radius R2 are not limited to particular values, it is preferred that the first curvature radius R1 is in the range of 120 mm≤R1≤240 mm, and the second curvature radius R2 is in the range of 750 mm≤R2≤880 mm. With such values, any change or disturbance in conditions of the convection flow of the silicon melt can be suppressed in a more stable manner.

While the mouth diameter of the quartz glass crucible 1A is not limited to a particular value, a larger mouth diameter is particularly preferred in the present invention. For example, the mouth diameter may be 32 inches (about 800 mm) or more.

The bottom portion 5 is preferably sized to have a width W, as viewed in a cross-section including the central axis 6 of the quartz glass crucible 1A (hereinafter also referred to as a "bottom portion cross-sectional width W"), of 60 mm or more. With the width W in such a range, point contact between the outer surface of the bottom portion of the quartz glass crucible and the inner surface of the bottom portion of the graphite crucible can be inhibited in a more stable manner.

It is preferred that the graphite crucible in which the quartz glass crucible is to be installed is of a closed-end cylindrical shape and has an inner surface that includes a straight body portion with a cylindrical inner peripheral surface, a first curved portion continuous with a lower end of the straight body portion and having a first curvature radius R3, and a second curved portion continuous with the first curved portion and having a second curvature radius R4, where, in the relationship between the quartz glass crucible and the graphite crucible, the first curvature radius R1 of the quartz glass crucible satisfies an equation of R1=R3±50 mm and the second curvature radius R2 of the quartz glass crucible satisfies an equation of R2=R4±50 mm. Any combination of the quartz glass crucible and the graphite crucible satisfying such a relationship can further suppress any change or disturbance in the conditions of the convection flow of the silicon melt.

Second Embodiment

FIG. 3 illustrates another example of the quartz glass crucible according to the present invention. Descriptions of similar components to those in FIG. 1 will be omitted as appropriate. The quartz glass crucible 1B according to the present embodiment includes the bottom portion 5 that has an outer surface shaped into a concave surface 5B concave with respect to the flat surface perpendicular to the central axis 6 of the quartz glass crucible. Such a shape can provide the same effects as those in the first embodiment. While the concave surface 5B is not limited to a particular shape as long as it is concave with respect to the flat surface perpendicular to the central axis 6 of the quartz glass crucible, in terms of ensuring the maximum stability, it is preferred that the concave surface 5B has a shape symmetric about the central axis 6, in other words, an edge of the concave portion has a circular shape centered on the central axis when the quartz glass crucible 1B is viewed in the direction of the central axis 6 from the outer surface of the bottom portion.

EXAMPLE

The present invention is described below in detail using Examples, although these Examples do not limit the present invention.

As shown below, quartz glass crucibles with a 32 inch (about 800 mm) mouth diameter and each having a different shape except for the straight body portion were placed in a graphite crucible for evaluation. The evaluation began by investigating whether rattling would occur when each quartz glass crucible was installed inside the graphite crucible. To evaluate the presence or absence of rattling, each quartz glass crucible was placed on a horizontal platform, and, at 30 cm height from the platform, the quartz glass crucible was pushed horizontally in the area of 200 mm$^2$ with the force of 8N using a force gauge. If the quartz glass crucible was raised on its pushed side and tilted at 10 degrees or more, that quartz glass crucible was determined to have rattling (poor). It should be noted that the vertical direction relative to the ground was defined as 0 degrees, and if the quartz glass crucible was tilted prior to application of the force, the degrees were also added.

Then, a single crystal silicon ingot was grown using the CZ method. The presence or absence of dislocations in the grown single crystal silicon ingot was evaluated to evaluate a change or disturbance in the convection flow of the silicon melt during growing of the single crystal silicon ingot. The graphite crucible in which each quartz glass crucible was to be installed had an inner surface including a straight body portion with a cylindrical inner peripheral surface, a first curved portion continuous with a lower end of the straight body portion and having a first curvature radius R3 of 180 mm, and a second curved portion continuous with the first curved portion and having a second curvature radius R4 of 815 mm.

Comparative Example 1

A quartz glass crucible including a cylindrical straight body portion, a first curved portion having a first curvature radius R1 of 180 mm, and a second curved portion having a second curvature radius R2 of 815 mm was used. The quartz glass crucible of Comparative Example 1 included a bottom portion with a convex shaped outer surface.

Comparative Example 2

A quartz glass crucible including a cylindrical straight body portion, a first curved portion having a first curvature radius R1 of 180 mm, and a flat surface with a cross-sectional bottom portion width W of 570 mm was used.

Example 1

A quartz glass crucible including a cylindrical straight body portion, a first curved portion having a first curvature radius R1 of 180 mm, a second curved portion having a second curvature radius R2 of 815 mm, and a bottom portion having a concave surface with a cross-sectional bottom portion width W of 60 mm was used.

Example 2

A quartz glass crucible similar to that of Example 1 was used, except that the cross-sectional bottom portion width W was set to 50 mm.

Example 3

A quartz glass crucible including a cylindrical straight body portion, a first curved portion having a first curvature radius R1 of 130 mm, a second curved portion having a second curvature radius R2 of 765 mm, and a bottom portion having a flat surface with a cross-sectional bottom portion width W of 255 mm was used.

Example 4

A quartz glass crucible similar to that of Example 3 was used, except that the first curvature radius R1 was set to 230 mm, the second curvature radius R2 was set to 865 mm, and the cross-sectional bottom portion width W was set to 140 mm.

Example 5

A quartz glass crucible similar to that of Example 4 was used, except that the first curvature radius R1 was set to 110 mm, the second curvature radius R2 was set to 815 mm, and the cross-sectional bottom portion width W was set to 140 mm.

Example 6

A quartz glass crucible similar to that of Example 5 was used, except that the first curvature radius R1 was set to 250 mm.

Example 7

A quartz glass crucible similar to those of Examples 5 and 6 was used, except that the first curvature radius R1 was set to 180 mm and the second curvature radius R2 was set to 740 mm.

Example 8

A quartz glass crucible similar to that of Example 7 was used, except that the second curvature radius R2 was set to 890 mm.

The shape data for the quartz glass crucibles of Comparative Examples 1 and 2 and Examples 1-8 as well as their evaluation results are shown in Table 1.

TABLE 1

| | Outer surface shape of crucible bottom portion | R1 | R2 | Bottom portion cross-sectional width (mm) | Rattling | Convection flow of silicon |
|---|---|---|---|---|---|---|
| Comp. Ex. 1 | Convex surface | 180 | 815 | 0 | poor | good |
| Comp. Ex. 2 | Flat surface | 180 | — | 570 | good | poor |
| EX. 1 | Concave surface | 180 | 815 | 60 | good | good |
| EX. 2 | Concave surface | 180 | 815 | 50 | fair | good |
| EX. 3 | Flat surface | 130 | 765 | 255 | good | good |
| EX. 4 | Flat surface | 230 | 865 | 140 | good | good |
| EX. 5 | Flat surface | 110 | 815 | 140 | good | fair |
| EX. 6 | Flat surface | 250 | 815 | 140 | good | fair |
| EX. 7 | Flat surface | 180 | 740 | 140 | good | fair |
| EX. 8 | Flat surface | 180 | 890 | 140 | good | fair | good: Tilt less than 5°
fair: Tilt 5° or more and less than 10°
poor: Tilt 10° or more As shown in Table 1, it can be seen that shaping the outer surface of the bottom portion of the quartz glass crucible into a flat surface or a concave surface, as in Examples 1-8 and Comparative Example 2, enables the quartz glass crucible to be stable and self-supporting inside the graphite crucible. However, the quartz glass crucible of Comparative Example 2, which did not have the second curved portion, experienced a change or disturbance in the convection flow of the silicon melt. On the other hand, it can also be seen that the use of the quartz glass crucible with the first curved portion having the first curvature radius R1 and the second curved portion having the second curvature radius R2, where the relationship of R1<R2 is satisfied, can suppress any change or disturbance in the convection flow of the silicon melt during growing of the single crystal silicon ingot, as in Examples 1-8. Additionally, each of the quartz glass crucibles of Examples 1-8 could be stably stored with its bottom portion facing down, in the same manner as when disposed inside a graphite crucible, without the use of a special jig or the like, providing better operational efficiency and safety during normal storage.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A quartz glass crucible for growing a single crystal silicon ingot by a CZ method, wherein
   the quartz glass crucible has a closed-end cylindrical shape comprising a cylindrical straight body portion, a first curved portion continuous with a lower end of the cylindrical straight body portion and having a first curvature radius $R1$, a second curved portion continuous with the first curved portion and having a second curvature radius $R2$, and a bottom portion continuous with the second curved portion,
   the first curvature radius $R1$ and the second curvature radius $R2$ have a relationship of $R1<R2$,
   an outer surface of the bottom portion forms a concave surface, and
   a shape of an inner surface of the quartz glass crucible as viewed in a cross section including a central axis of the quartz glass crucible is a concave curved surface shape.

2. The quartz glass crucible according to claim 1, wherein
   the first curvature radius $R1$ is in a range of 120 mm≤$R1$≤240 mm, and
   the second curvature radius $R2$ is in a range of 750 mm≤$R2$≤880 mm.

3. The quartz glass crucible according to claim 1, wherein a width of the bottom portion when viewed in the cross section including the central axis of the quartz glass crucible is 60 mm or more.

4. The quartz glass crucible according to claim 2, wherein a width of the bottom portion when viewed in the cross section including the central axis of the quartz glass crucible is 60 mm or more.

* * * * *